(12) United States Patent
Asam et al.

(10) Patent No.: US 11,165,425 B2
(45) Date of Patent: Nov. 2, 2021

(54) POWER SUPPLY DETECTION CIRCUIT

(71) Applicant: NEXPERIA B.V., Nijmegen (NL)

(72) Inventors: Geethanadh Asam, Nijmegen (NL);
Harrie Horstink, Nijmegen (NL);
Walter Tercariol, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 0 days.

(21) Appl. No.: 16/822,093

(22) Filed: Mar. 18, 2020

(65) Prior Publication Data
US 2020/0304125 A1 Sep. 24, 2020

(30) Foreign Application Priority Data

Mar. 22, 2019 (EP) .................................... 19164578

(51) Int. Cl.
*H03K 19/0185* (2006.01)
*H03K 3/037* (2006.01)
*H03K 19/00* (2006.01)
*H03K 19/003* (2006.01)

(52) U.S. Cl.
CPC ... *H03K 19/018528* (2013.01); *H03K 3/0377* (2013.01); *H03K 19/0016* (2013.01); *H03K 19/00384* (2013.01)

(58) Field of Classification Search
CPC ......... H03K 19/018528; H03K 3/0377; H03K 19/0016; H03K 19/00384; H03K 19/00369
See application file for complete search history.

(56) References Cited

U.S. PATENT DOCUMENTS

| | | | | |
|---|---|---|---|---|
| 6,166,577 A * | 12/2000 | Mizuno | .......... | H03K 19/018585 327/278 |
| 6,351,179 B1 * | 2/2002 | Ikehashi | .................. | G05F 1/465 323/316 |
| 8,063,674 B2 * | 11/2011 | Kwon | ................... | H03K 17/223 327/143 |
| 2006/0235630 A1 | 10/2006 | Ito et al. | | |
| 2008/0100341 A1 * | 5/2008 | Kim | ............... | H03K 19/018521 326/63 |
| 2008/0218223 A1 * | 9/2008 | Kimura | .................... | H03K 5/19 327/142 |
| 2011/0187439 A1 * | 8/2011 | Sugie | .................... | H03K 17/687 327/424 |

OTHER PUBLICATIONS

Millman et al. "Microelectronics" second edition, McGraw-Hill Book Company, pp. 148-149 (Year: 1987).*
Narveer, eVLSI.com—VLSI Design Forum "Why PMOS always have bigger size than NMOS?", p. 1 (Year: 2014).*
European Search Report for priority European application No. EP19164578.7, 4 pages, dated Oct. 10, 2019.

* cited by examiner

*Primary Examiner* — Daniel D Chang
(74) *Attorney, Agent, or Firm* — Ohlandt, Greeley, Ruggiero & Perle L.L.P.

(57) ABSTRACT

This disclosure relates to a power supply detection circuit, including: a first input stage field effect transistor; an inverter stage; and a feedback stage field effect transistor. The inverter stage includes a complimentary pair of transistors that includes an NMOS transistor and a PMOS transistor configured and arranged such that gate lengths of the PMOS and NMOS transistors are different. The disclosure also relates to an integrated circuit including a power supply detection circuit.

17 Claims, 8 Drawing Sheets

POWER SUPPLY DETECTION CIRCUIT

CROSS REFERENCE TO RELATED APPLICATION

This application claims the benefit under 35 U.S.C. § 119(a) of European Application No. 19164578.7 filed Mar. 22, 2019 the contents of which are incorporated by reference herein in their entirety.

BACKGROUND OF THE DISCLOSURE

1. Field of the Disclosure

The present disclosure relates to a power supply detection circuit. The present disclosure also relates to an integrated circuit comprising the power supply detection circuit and more particularly a logic integrated circuit.

2. Description of the Related Art

In power supply circuits for integrated circuits such as logic circuits, during power turn-on or ramp-up the DC supply voltage (or Vcc) will rise and eventually stabilise at a specific DC value. As the DC supply ramps-up, transistors in the power supply circuit go through subthreshold voltages before the voltage nodes, such the gate, source or drains reach the specific desired DC supply voltage (Vcc). Operation of the transistors at subthreshold voltages can lead to unwanted voltage pulses at the output of the power supply. Such unwanted voltage pulses, also known as glitches can cause unwanted behaviour in the integrated circuit to which the power supply circuit is connected.

A glitch may be defined as an unwanted voltage or signal on the output of an electronic circuit, such as a logic circuit. Looking at a generalised data transfer system as illustrated in FIG. 1, data is received at an input of a first logic circuit, System A. The output of the first logic circuit is connected to the input of a second circuit, System B, and the second circuit provides a data output for connection to further circuitry (not illustrated). During operation the second circuit may be enabled (in other words powered up) and ready to receive data from the first logic circuit but the first logic circuit may not be ready to transfer data to the enabled second circuit. In this situation, if there are any glitches, or unwanted voltages or signals generated by the first logic circuit, they will be transferred to the enabled second circuit. If the amplitude of the glitch is greater than an input threshold voltage of the second circuit the glitch will be processed by the second circuit which may lead to an erroneous and unwanted signal at the output of the second circuit. Currently the effects of the glitches can be reduced by synchronising the turn on of the electronic circuit supply voltage with the turn on of the second circuit. However, synchronisation requires an additional timing signal between the two circuits which prevents switch on of the second circuit until the glitch has passed.

Furthermore, with a slow rising power supply, a supply detection circuit usually enables the driver and other circuits drawing current from Vcc. When current is forced from power supply, the Vcc level can drop causing the threshold of supply detection to shift and may disable the output from returning to Vcc leading to voltage oscillations which can cause excess current.

SUMMARY

Various example embodiments are directed to issues such as those addressed above and/or others which may become apparent from the following disclosure. In particular, but not limited to, a power supply detection circuit which may mitigate power supply output glitches caused by subthreshold voltages during power supply ramp-up.

In certain example embodiments, aspects of the present disclosure involve the single power supply detection circuits. In other example embodiments aspects of the present disclosure involve the dual power supply detection circuits.

According to an embodiment there is provided a power supply detection circuit, comprising: first input stage field effect transistor; an inverter stage; a feedback stage field effect transistor; wherein the inverter stage comprises a complimentary pair of transistors, the complimentary pair of transistors comprising an NMOS transistor and a PMOS transistor configured and arranged such that a gate lengths of the PMOS and NMOS transistors are different.

The inverter stage may comprise at least two complimentary pairs of transistors, comprising first and second NMOS transistors and first and second PMOS transistors; wherein the gate length of the first NMOS transistor is greater than the gate length of the first PMOS transistor, and the gate length of the second PMOS transistor is greater than the gate length of the second NMOS transistor. The gate length of feedback stage field effect transistor may be less than gate length of the input stage field effect transistor.

Optionally, the power supply detection circuit may further comprise a feedforward stage, connected between an output of the input stage field effect transistor and an input of a NOR stage.

The NOR stage may comprise first and second complimentary NMOS and PMOS transistors, wherein the gate length of the PMOS transistors is greater than the gate length of the NMOS transistors.

The output of the inverter stage may be connected to first and second inputs of the NOR stage.

The gate length of the feedback stage field effect transistor may be less than the gate length of an input stage field effect transistor to provide a supply voltage hysteresis.

Optionally, the power supply detection circuit may further comprise a second input stage transistor connected in series with the first input stage transistor.

Optionally, the power supply detection circuit may further comprise a first resistor, a second resistor and a third resistor, wherein the first and second resistors are connected between a source and drain of the feedback stage field effect transistor and the third resistor is connected between the second resistor and a source of the input field effect transistor.

The total resistance of the first resistor, second resistor and third resistor may be greater than the drain source resistance of the input stage transistor.

Optionally, the power supply detection circuit may further comprise a first filter capacitor and a second filter capacitor configured and arranged to filter high frequency supply voltage ramps.

The first filter capacitor may be connected between the first and second resistors and a second filter capacitor is connected.

There is also provided an integrated circuit comprising a power supply detection circuit according to embodiments. The integrated circuit may be a logic circuit. The logic circuit may be one of, or any combination of: a buffer; an inverter; an AND gate; a NAND gate; an OR gate; a NOR gate; an Exclusive-NOR gate; or an Exclusive-OR gate.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
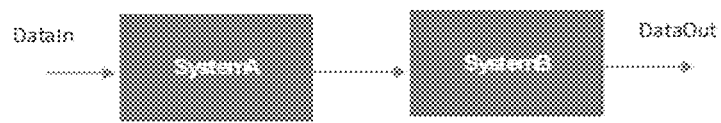
FIG. 1 shows a known generalised data transfer system.
Figure 2:
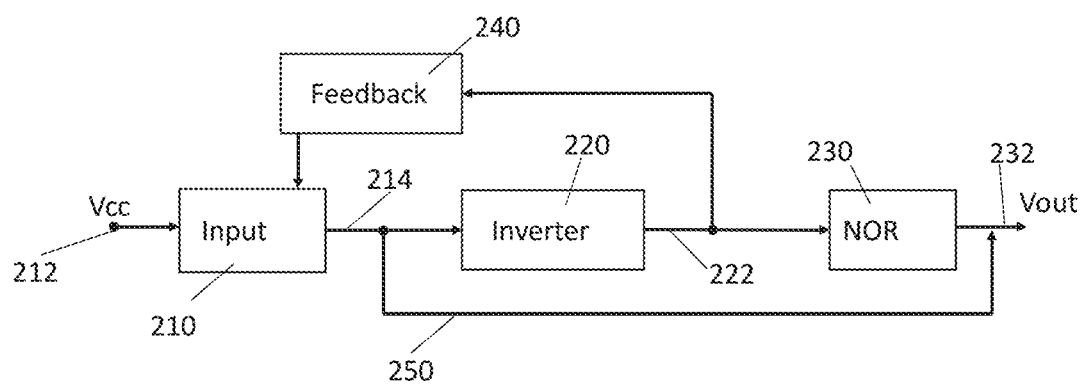
FIG. 2 illustrates a block diagram of a power supply detection circuit according embodiments.

FIG. 2 illustrates a generalised functional block diagram of a power supply detection circuit 200 according embodiments. In overview, the power supply detection circuit 200 comprises: an input stage 210; an inverter stage 220; a NOR stage 230; a feedback stage 240; and, a feedforward line 250.

The input stage 210 comprises an input terminal 212 for receiving the input power supply voltage Vcc. The input stage 210 comprises an output line 214 connected to the input of the inverter stage 220. An inverter output line 222 from the inverter stage 220 is connected to the NOR stage 230. In addition, the inverter output line 222 is also connected to a feedback stage 240, and the feedback stage 240 is in turn connected to the input stage 210. A feedforward loop 250 is connected from the output line 214 of the input stage an output line 232 of the NOR stage. The NOR stage output line 232 provides the output voltage Vout of the power supply detection circuit 200.

When the input power supply voltage (or a certain fraction thereof) is present at the input of the input stage 210, the input stage 210 will partially turn on and an undefined voltage at the output of 210 which may cause an unwanted voltage pulse or glitch will be passed to the inverter stage 220. The inverter 220 is configured to attenuate or reduce the amplitude of the voltage and glitch from the input stage 210. The attenuated voltage and glitch from the inverter 220 are then feedback through the feedback stage 240 to the input stage 212. The feedback stage 240 provides hysteresis, that is the voltage difference between a ramp-up threshold voltage (for example, Vcc1, as discussed below) and a ramp down threshold voltage. By using hysteresis, any drop in input power supply voltage which can cause false disable signals are prevented, thus preventing oscillations which can cause excess current and/or glitches in the output.

The output 222 of the inverter stage 220 is also connected to the input of the NOR stage. The NOR stage 230 this is used when the input power supply voltage begins to ramp down below threshold (for example Vcc2, as discussed below) and disables or bypasses the inverter stage 220.

Figure 3:
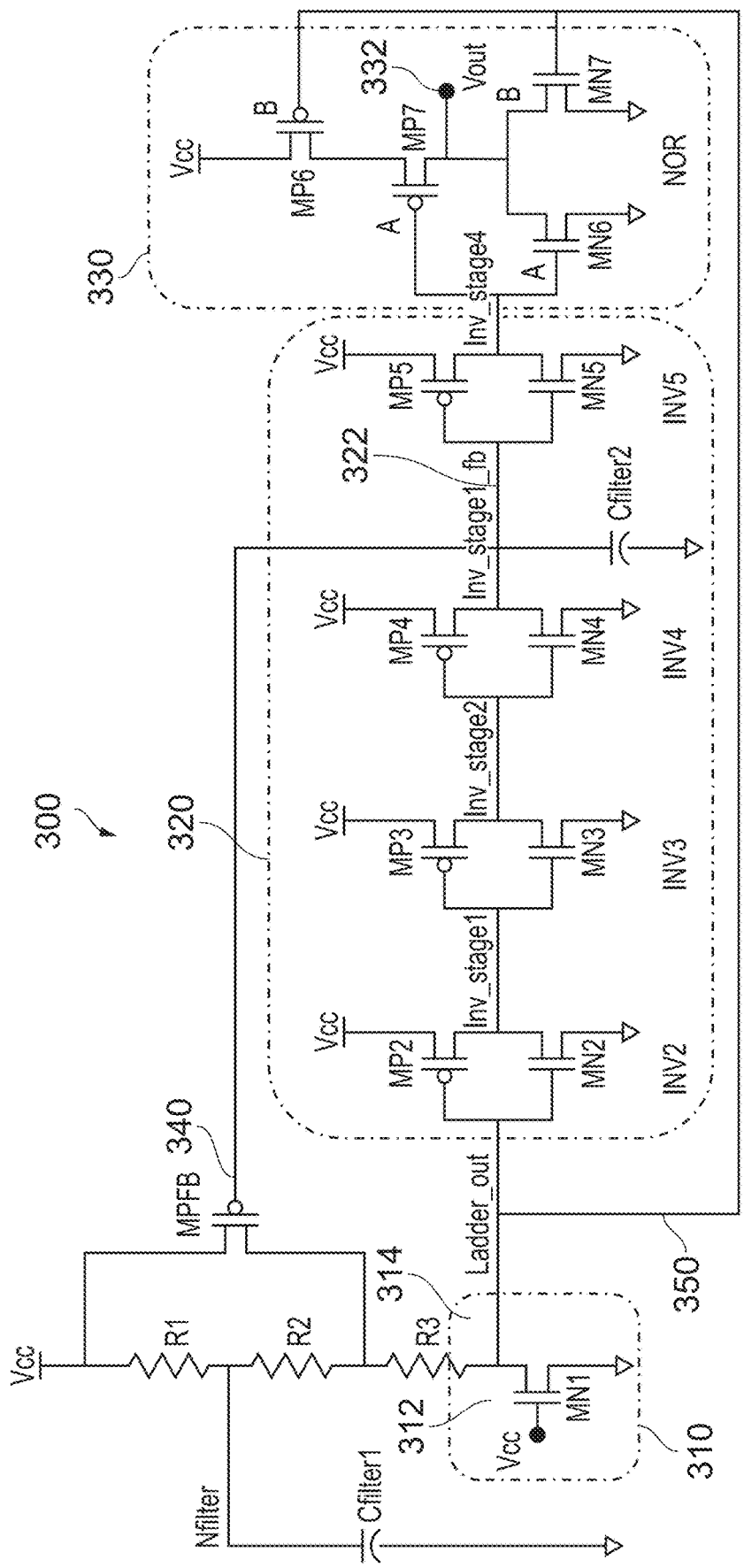
FIG. 3 illustrates a circuit diagram of a single supply power supply detection circuit according embodiments.

FIG. 3 illustrates a circuit diagram, implementing a single supply detection circuit 300, embodying the generalised functional block diagram of FIG. 2. The input stage 310 comprises an input n-channel transistor MN1 having gate, source and drain terminals. The gate terminal of the input transistor MN1 forms the input terminal 312 of the input stage 310. The source terminal of the input transistor MN1 forms the output terminal 314 of the input stage 310, and the drain terminal is connected to ground. The source terminal is also connected to the supply voltage Vcc via resistors R1, R2 and R3 and feedback transistor MPFB.

The output terminal 314 of the input stage 310 is connected to the input of the inverter stage 320. The inverter stage comprises series connected inverters. In this example the inverter stage comprises four, namely first inverter INV2, second inverter INV3, third inverter INV4 and fourth inverter INV5, however the skilled person will appreciate that the any number can be chosen. Each of the inverters INV2, INV3, INV4 and INV5 are formed of complimentary NMOS transistor and PMOS transistors, where the inverters are connected in series. The gates of the NMOS transistor MN2 and PMOS transistor MP2 are connected together and to the output 314 of the input stage 310. Likewise, the gates of the NMOS transistor MN3 and PMOS transistor MP3 are connected together, and so on for higher order complimentary NMOS and PMOS transistor pairs.

The source of each of the PMOS transistors MP2, MP3, MP4, MP5 are connected to the supply voltage Vcc. The drain terminals of each of the NMOS transistors MN2, MN3, MN4, MN5 are connected to ground. The drain terminals of the PMOS transistors MP2, MP3, MP4 are connected to respective source terminals of the NMOS transistors MN2, MN3, MN4 to form gate connections to the higher order inverters. For example, the drain terminal of the PMOS transistor MP2 is connected to the source terminal of the NMOS transistor MN2 which are in turn connected to the gate terminals of the PMOS transistors MP3 and NMOS transistors MN3. This forms a series connection of inverters INV2, INV3, INV4, INV5. For the final inverter in the series, in this case INV5, the drain terminal of the PMOS transistor MP5 is connected to the source terminal of the NMOS transistor MN5, and this connection forms the output of the inverter stage 320, which is connected to the feedback stage 340 and the input of the NOR stage 330 as discussed in more detail below.

The first inverter INV2 is formed of a PMOS transistor MP2 and an NMOS transistor MN2. The second inverter INV3 is formed of a PMOS transistor MP3 and an NMOS transistor MN3. The third inverter INV4 is formed of a PMOS transistor MP4 and an NMOS transistor MN4. The fourth inverter INV5 is formed of a PMOS transistor MP5 and an NMOS transistor MN5.

Each of the first, second, third and fourth inverters are arranged such that gate lengths, L, of the PMOS and NMOS transistors of each inverter are not equal. More specifically, the gate length $L_{MP2}$ of the PMOS transistor MP2 is greater than the gate length $L_{MN2}$ of the NMOS transistor MN2. Likewise, the gate length $L_{MN3}$ of the NMOS transistor MN3 is greater than the gate length $L_{MP3}$ of the PMOS transistor MP3. In addition, the gate length $L_{MP4}$ of the PMOS transistor MP4 is greater than the gate length $L_{MN4}$ of the NMOS transistor MN4. The gate length $L_{MN5}$ of the NMOS transistor MN5 is greater than the gate length $L_{MP5}$ of the PMOS transistor MP5. The skilled person will see that the relative gate lengths alternate for each subsequent inverter may can be given more generally by:

$$L_{Pn} > L_{Nn}, L_{Nn} > L_{Pn}$$

In this way the gate lengths of the present embodiment can be described as follows:

$$L_{MP2} > L_{MN2}, L_{MN3} > L_{MP3}, L_{MP4} > L_{MN4} \text{ and } L_{MN5} > L_{MP5}$$

This arrangement of gate lengths ensures that alternating transistors follow the power supply voltage, Vcc and ground. During power supply voltage ramp up, when the gate length of NMOS transistors is greater than the gate length of the corresponding PMOS transistor, the subthreshold current of the PMOS transistor in the complimentary pair dominates the corresponding NMOS transistor of the complimentary pair. Conversely, when the gate length of PMOS transistor is greater than the gate length of corresponding NMOS transistor, the subthreshold current of NMOS transistor dominates the PMOS transistor.

In this way, when the gate length of a PMOS transistor is greater than the gate length of the corresponding NMOS transistor the inverter output to will be pulled low as subthreshold current of NMOS transistor dominates that of corresponding PMOS transistor. Similarly, when the gate length of an NMOS transistor is greater than the gate length of the corresponding PMOS transistor, the inverter output to will follow the power supply voltage Vcc because the subthreshold current of PMOS transistor dominates that of corresponding NMOS transistor.

The skilled person will see therefore that first inverter INV2 output has a preference to follow ground, the second inverter INV3 has a preference to follow the supply voltage Vcc, the third inverter INV4 has a preference to ground, and the fourth inverter INV5 has a preference to follow the supply voltage Vcc during power supply ramp up. This arrangement can attenuate any glitches that occur in any of the stages during power supply voltage ramp-up.

The number of inverters may be chosen dependent of the required amount of attenuation and the available area on the integrated circuit design. The skilled person will appreciate that a higher number of inverters will give increased attenuation but at the loss of available area on the integrated circuit design.

As mentioned above the output of the inverter stage 320 is connected to the input of the NOR stage 330. The NOR stage 330 is arranged as a two input NOR gate, where the first inputs A, are connected to the output of the fourth inverter INV5, and the second inputs B are connected to the output transistor MN1 via a feedforward loop 350. The first inputs A are formed by gates of two complimentary transistors MN6 and MP7. The second inputs B are formed by the gates of complimentary transistors MN7 and MP6.

The output of the NOR stage 330 and thus the output 332 of the single supply detection circuit 300 is arranged at the node of the drain terminal of transistor MP7, the source terminal of transistor MN6 and source terminal of transistor MN7. The NOR stage 330 is configured and arranged to disable the inverter stage when the supply voltage ramps down.

The gate lengths of the NMOS and PMOS transistors forming NOR stage are arranged such that the gate length of transistors MP6 and MP7 are greater than the gate lengths transistors MN6 and MN7.

Looking back to the inverter stage 320, the output 322 feeds back to a feedback stage 340. The feedback stage comprises a feedback transistor MPFB and network of resistors R1, R2 and R3 connected thereto, to limit the current from supply voltage Vcc to ground through the input transistor MN1. The feedback transistor MPFB may be PMOS transistor and the output 322 is connected to the gate terminal thereof. The network of resistors R1, R2 and R3 are provided to limit the flow of current from supply voltage Vcc to ground. Specifically, as the supply voltage ramps up and is detected at the input stage, the n-channel transistor MN1 turns on and draws current from the supply voltage Vcc. The resistive network R1, R2 and R3 limits the shoot through current from supply to ground and prevents static currents. The gate length $L_{MN1}$ of the input transistor MN1 is greater than the gate length $L_{MPFB}$ of the feedback transistor MPFB. The feedback arrangement described above provides hysteresis as discussed in more detail above.

Optionally, a first filter capacitor Cfilter1 may be connected at the node between resistors R2 and R1. Likewise, a second filter capacitor Cfilter2 may be connected between the output of inverter INV4 and the input of inverter INV5. Filter capacitors Cfilter1 and Cfilter2 may be provided to filter high frequency ramps. This enables the power supply to be switched at high frequencies by holding voltage constant on capacitor Cfilter1 as the supply ramps down, whereas capacitor Cfilter2 filters voltage during supply ramp up.

Figure 4:
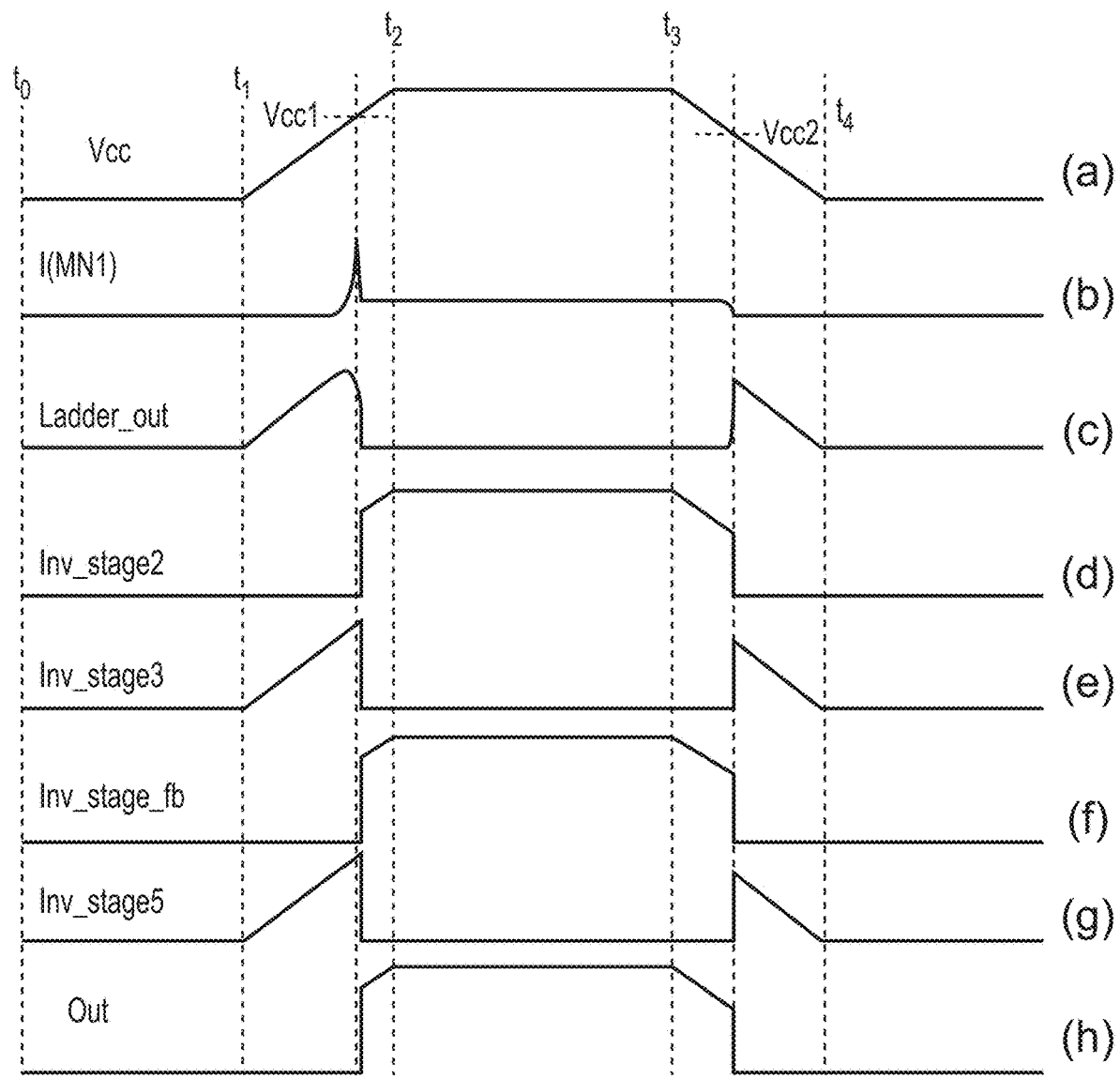
FIG. 4 illustrates various waveforms (a) to (h) during operation of the single supply power supply detection circuit according to FIG. 3.

Operation of the single supply detection circuit 300, may be understood by starting at the gate of the input transistor MN1 and with reference to waveform (a) of FIG. 4. The waveforms of FIGS. 4(a) to (h) show amplitude on the vertical axis and time, t, on the horizontal axis. For waveform (a), between $t_0$ and $t_1$ the voltage of Vcc at the gate terminal of the input transistor is zero. As Vcc rises between $t_1$ and $t_2$, Vcc will be below the threshold voltage Vth Vcc1, required to create a conductive channel between the source and drain terminals of the input transistor MN1, and the voltage at the output, that is the drain terminal, of the input transistor MN1 will be equal to the instantaneous voltage of Vcc across the series resistors R1, R2, R3, that is the subthreshold voltage at the gate of the input transistor MN1. A mentioned above, the gate length $L_{MP2}$ of the PMOS transistor MP2 is greater than the gate length $L_{MN2}$ of the NMOS transistor MN2 of the first inverter INV2, and as a result the leakage current of the NMOS transistor MN2 dominates that of PMOS transistor MP2 because for a specific current, the drain to source voltage smaller on NMOS transistor MN2 than on PMOS transistor MP2. As a result, the output of INV2 is pulled to ground. The voltage at the input of the inverter stage 320 (that is the gates of PMOS transistor MP2 and NMOS transistor MN2) will follow that at the source of the input transistor MN1 and the output of inverter INV2 (that is the voltage on the drain of PMOS transistor MP2 and the source of NMOS transistor MN2) will be at ground because of the gate length differences as described.

Likewise, the output of inverter INV3 (waveform (d)) (that is the voltage on the drain of PMOS transistor MP3 and the source of NMOS transistor MN3) will be at the instantaneous voltage Vcc because the gate length $L_{MN3}$ is greater than $L_{MP3}$. Also, the output of inverter INV2 follows ground which leads to a higher gate source voltage for PMOS transistor MP3 than NMOS transistor MN3 because PMOS transistor MP3 is switched on and NMOS transistor MN3 switched is off. Furthermore, the output of inverter INV4 (waveform (f)) (that is the voltage on the drain of PMOS transistor MP4 and the source of NMOS transistor MN4) will be at ground and the output of inverter INV5 (that is the voltage on the drain of PMOS transistor MP5 and the source of NMOS transistor MN5) will be at the instantaneous voltage Vcc. Vout follows ground whenever the supply voltage Vcc is lower than the threshold voltage of MN1. This is due to the above discussed gate length differences and because output terminal 314 of the input stage 310 follows the supply voltage Vcc.

As mentioned above, the gate length $L_{MN1}$ of the input transistor MN1 is greater than the gate length $L_{MPFB}$ of the feedback transistor MPFB and as such, the leakage current of the feedback transistor MPFB dominates input transistor MN1 when Vcc is in the subthreshold region of the input transistor MN1. This is due to feedback resistor MPFB being turned on and turns on before input transistor MN1 when supply voltage Vcc is ramping up.

As Vcc approaches the threshold voltage Vth Vcc1 of the input transistor MN1 it will begin to turn on, that is it will conduct from source to drain, drawing current from resistor R3 and feedback transistor MPFB because gate length of feedback transistor MPFB is less than MN1 and resistors R1 and R2 are by-passed by the feedback transistor, thus lowering the voltage at the output 314 of the input transistor MN1. The output terminal 314 of the input stage 310 now follows the supply voltage Vcc, because MN1 is above threshold and turned on this pulls the resistive ladder R1, R2, R3 to ground. The drain-source resistance of the feedback transistor MPFB is lower than the total resistance of resistors R1 and R2 such that the current from through feedback transistor MPFB is greater than the current through resistors R1 and R2. As Vcc continues to rise, the voltage at the output of input transistor MN1 (waveform (c)) becomes lower than the threshold voltage of the first inverter INV2. When Vcc reaches Vcc1, where Vcc1 is this the threshold voltage single supply detection circuit 300, the output of the first inverter INV2 switches from zero (or ground) to Vcc1 and will eventually follow the supply voltage Vcc. Likewise, when Vcc reaches Vcc1, the output of inverter INV3, inverter INV5 and will change from Vcc to zero, and the output of inverter INV4 and Vout will change from zero to Vcc. This is illustrated more clearly in the waveforms (c) to (h) of FIG. 4 as discussed below. When the output of INV4 is at Vcc, the feedback transistor MPFB turns off, thus allowing current to flow from Vcc through resistors R1, R2 and R3 such that the input transistor MN1 operates in triode mode. Input transistor MN1 operates in triode mode because resistors R1 and R2 get added to R3 which in turn reduces the current flowing from Vcc to ground through input transistor MN1. As R1 and R2 are designed to be higher than R3, MN1 enters into triode region because of lower current through R1, R2, R3, whereby the input transistor MN1 operates like a resistor, controlled by the gate voltage relative to both the source and drain voltages.

As Vcc further increases the input transistor MN1 acts as a switch where the drain source current through MN1 can be approximated as:

$$I_{MN1} \approx \frac{Vcc}{R1 + R2 + R3}$$

$$V_{Ladder\_out} = 0$$

For waveform (b), the drain source current of input transistor MN1 means that the resistance of MN1 is negligible compared sum of the resistances R1, R2, R3 such that the drain voltage drop of transistor MN1 is also negligible.

In this case the sum of R1, R2 and R3 are in the region of megaohms, whereas the resistance of MN1 will be in the region of kiloohms.

Waveform (c) illustrates the behaviour of the output of input transistor MN1 (Ladder_out) based on Vcc. As Vcc remains at zero between $t_0$ and $t_1$, Ladder_out remains at zero. As Vcc begins to ramp up at $t_1$ it can be seen that Ladder_out follows Vcc. As Vcc approaches Vcc1, Ladder_out begins to fall and reaches zero shortly after Vcc passes Vcc1.

As illustrated by waveform (d), until the Vcc reaches Vcc1, the output of the inverter INV2 will be at zero (ground). However, when Vcc reaches Vcc1 the output of inverter INV2 will increase to Vcc1. As Vcc further ramps-up reaching a maximum at time $t_2$, the output of inverter will also rise to Vcc at time $t_2$. Likewise, the same behaviour occurs for the output of INV4, as illustrated by waveform (f) and for the output of the NOR gate, Vout 322 as illustrated by waveform (h). If a glitch originates in any one of the stages prior to INV4 it will get attenuated by the other stages because of gate length differences for each invertor stage.

As illustrated by waveform (e), as Vcc ramps-up from time $t_1$ to Vcc1 at $t_{Vcc1}$ the output of the inverter INV3 will follow Vcc. However when Vcc reaches Vcc1 the output of the inverter INV3 will decrease to zero (ground). Likewise, the same behaviour occurs for the output of INV5, as illustrated by waveform (g).

Referring again to waveform (a) of FIG. 4, Vcc is at a maximum between time $t_2$ and time $t_3$. As Vcc ramps-down between time $t_3$ and time $t_4$ the waveforms (c) to (h) undergo the opposite behaviour to that described above. As shown in waveform (c), as Vcc ramps down it can be seen that Ladder_out remains at zero until Vcc reaches Vcc2. The difference between the voltage level between Vcc1 and Vcc2 is accounted for due to the voltage drops across the resistors R1, R2 and R3. For Vcc2 R1, R2 and R3 set the voltage drop. However, for Vcc1 only R3 sets the voltage drop. When Vcc reaches Vcc2, Ladder_out rises and then follows Vcc, because the input transistor MN1 goes into cut-off, reaching zero at time $t_4$. Between $t_3$ and $t_{Vcc2}$, as Vcc ramps down, the output of inverter INV2 will follow Vcc. When Vcc reaches Vcc2, the output of inverter INV2 falls to zero. Likewise, the same behaviour occurs for the output of INV4, as illustrated by waveform (f) and for the output of the NOR gate, Vout 322 as illustrated by waveform (h).

If the output 314 (Ladder_out) of the input transistor MN1 goes higher than threshold voltage of the NOR gate (MN6, MN7, MP6, MP7) Vout is pulled low. However, if output 314 is lower than the threshold of the NOR gate Vout will stay low as illustrated in waveform (h). Alternatively, if output 314 goes high, Vout goes low through the inverter stages.

As illustrated by waveform (e), as Vcc ramps-down to Vcc2, the output of the inverter INV3 will remain zero. When Vcc reaches Vcc2, the output of the inverter INV3 will follow Vcc. Likewise, the same behaviour occurs for the output of INV5, as illustrated by waveform (g).

The feedback transistor MPFB is implemented to define hysteresis for the supply detection circuit. The hysteresis voltage is defined as:

$$V_{hysterisis} = Vcc2 - Vcc1$$

The optional first filter capacitor Cfilter1 may be included to assist the voltage at the output of the input transistor MN1 to charge to a known predetermined amount, based on the resistor value, when the input transistor MN1 is on the off state. More specifically, if the supply voltage Vcc ramps down quickly, the voltage at the output of the input transistor MN1 will take some time to follow the supply voltage Vcc after the input transistor MN1 is turned off. If the product of sum of the resistors R1, R2, R3 and the parasitic capacitance at the output of the input transistor MN1 is large, the supply voltage Vcc falls at a faster rate before the voltage at the output of transistor MN1 starts to follow Vcc. Therefore, without the first filter capacitor Cfilter1 there may be a delay in the output voltage Vout reaching zero. The parasitic capacitance at the output of the transistor MN1 is made up of: the drain source and the drain body capacitance of the input transistor MN1; the gate to source capacitance of the transistors MN2 and MP2 making up the first inverter stage INV2, the contact capacitance of resistance R3; and the gate to source capacitance NOR stage transistors MP6 and MN7.

With regard to operation of the feedforward loop 350, because of the small current flowing through the input transistor MN1 when the supply Vcc ramps down, Vcc2 is lower than Vcc1, as explained above, the feedforward loop 350 connects the output of the input transistor MN1 to the NOR gate in order to pull the output Vout to zero as soon as the output of transistor MN1 begins to follow the supply voltage Vcc. This may be beneficial when the inverters INV2, INV3, INV4 and INV5 are operated in the subthreshold region and my not be fully functional. The first capacitance filter combined with the NOR gate operate to pull the supply voltage Vcc to zero as soon as MN1 is turned off.

Figure 5:
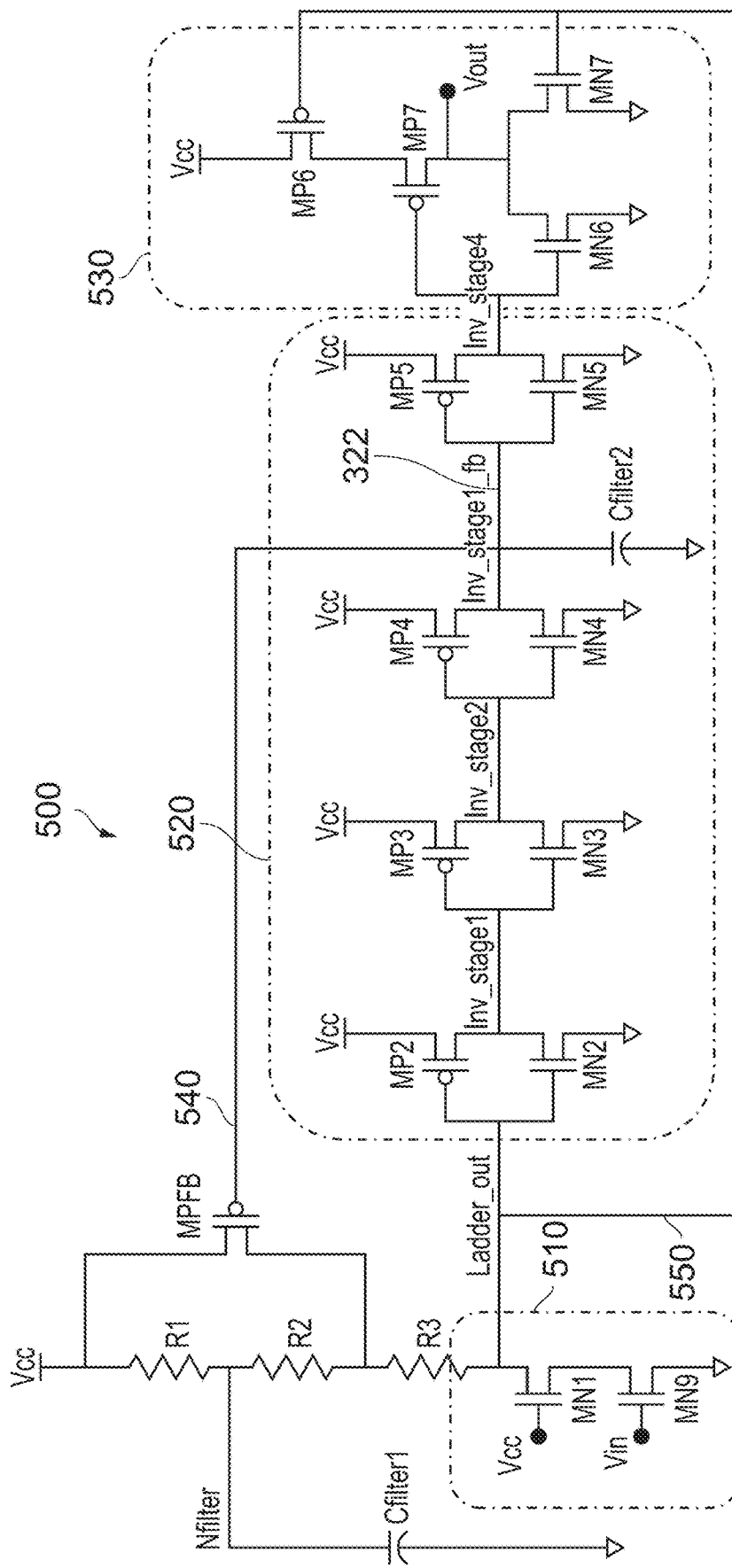
FIG. 5 illustrates a circuit diagram of a dual supply power supply detection circuit according embodiments.

FIG. 5 illustrates a circuit diagram, implementing a dual supply detection circuit 500. As with the functional block diagram of FIG. 2, and the single supply detection circuit of FIG. 3, the dual supply detection circuit 500 comprises: an input stage 510; an inverter stage 520; a NOR stage 530; a feedback stage 540; and, a feedforward line 550.

As with the single supply detection circuit, the input stage 510 of the dual supply detection circuit 500 comprises a first input transistor MN1 having gate, source and drain terminals for receiving a first input power supply voltage Vcc. In addition, the input stage 510 comprises second input transistor MN9 for receiving a second supply voltage Vin. The second input transistor MN9 comprises gate, source and drain terminals. The drain of the first input transistor MN1 is connected to the source of the second input transistor MN9 such that the first input transistor is in series with the second input transistor. The drain of the second input transistor MN9 is connected to ground (or zero). The remaining features of the dual supply detection circuit 500 are the same as those of the single supply detection circuit 300 discussed above. In this way the dual supply detection circuit 500 may be used to detect a second supply voltage Vin, typically used in dual supply voltage transceivers, and the inherent power supply voltage Vcc of the circuit 500.

Due to the inclusion of the second input transistor MN9, when both the supply voltage Vcc and the second supply voltage Vin are greater than the threshold voltage, the output voltage Vout will follow Vcc. Alternatively, when either the supply voltage Vcc or the second supply voltage Vin are less than the threshold voltage, Vout will be zero.

Figure 6:
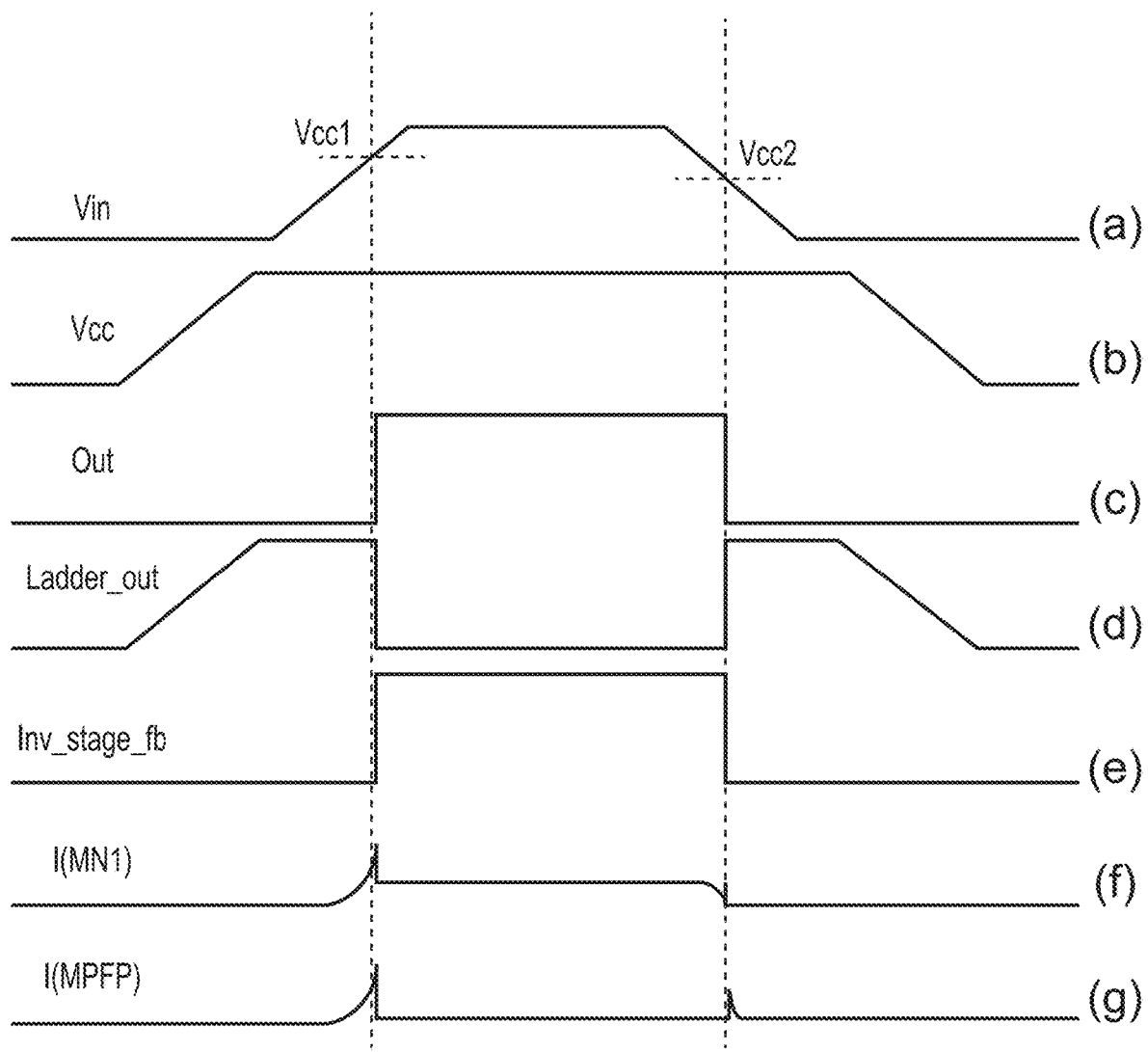
FIG. 6 illustrates various waveforms (a) to (g) during operation of the dual supply power supply detection circuit according to FIG. 5.
Figure 7:
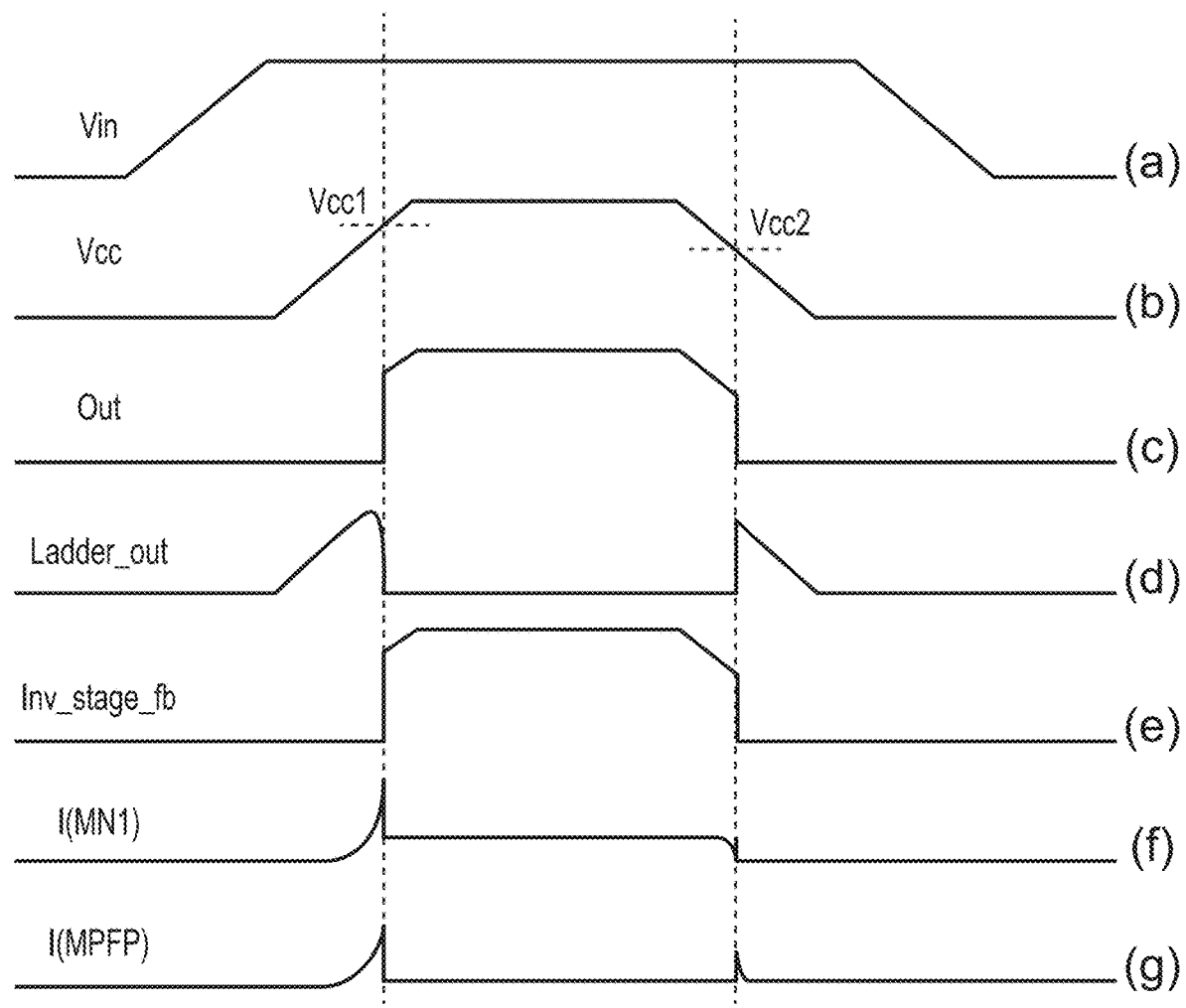
FIG. 7 illustrates various waveforms (a) to (g) during operation of the dual supply power supply detection circuit according to FIG. 5.
Figure 8:
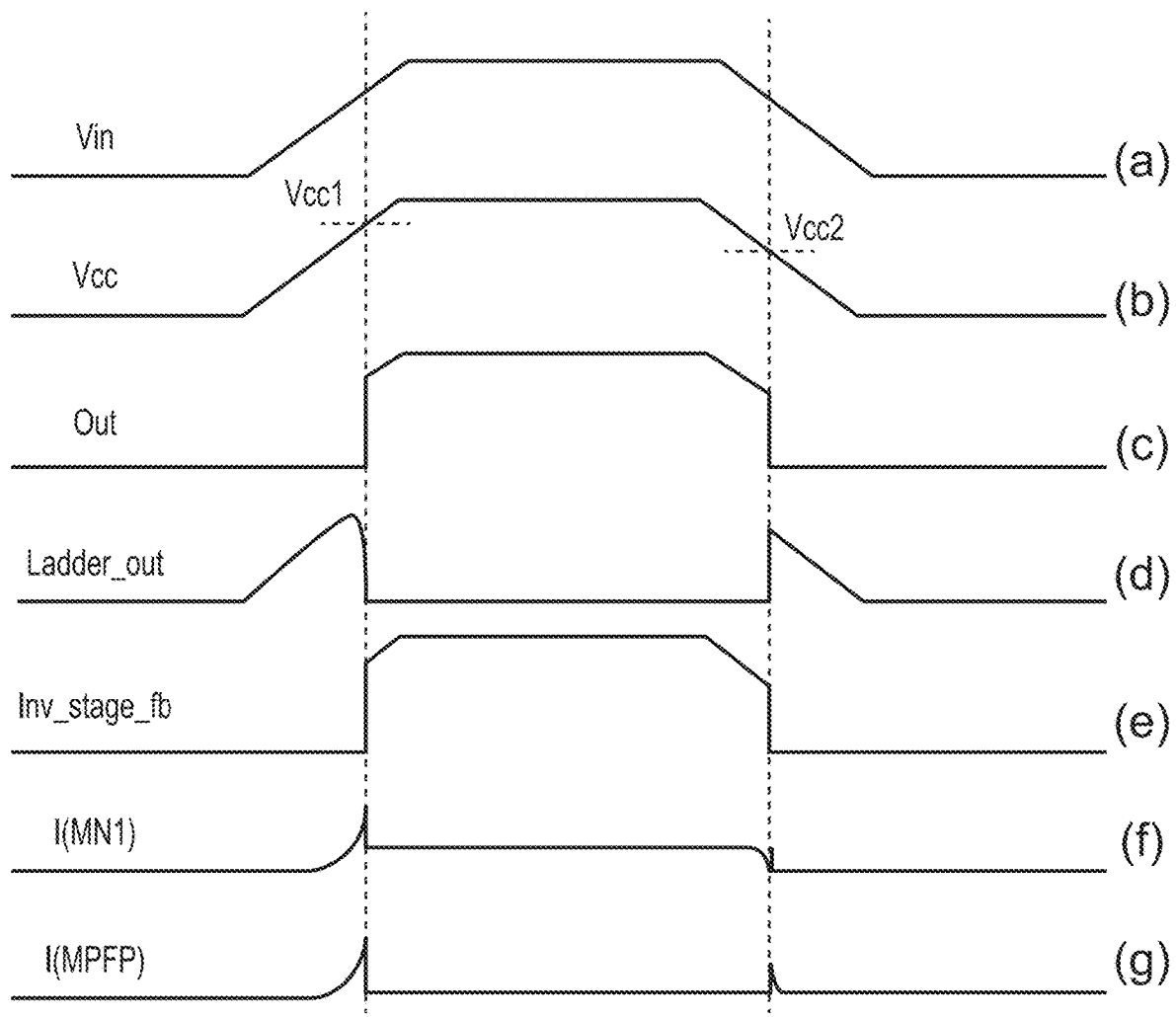
FIG. 8 illustrates various waveforms (a) to (g) during operation of the dual supply power supply detection circuit according to FIG. 5.

The operation of the dual supply detection circuit 500 can be understood with reference to the scenarios illustrated in FIGS. 6, 7 and 8.

The waveforms (a) to (g) of FIG. 6 show the operation of the circuit according to FIG. 5, when the second supply voltage Vin (waveform (a)) is enabled (or high) after the first supply voltage Vcc (waveform (b)) is enabled, and when the second supply voltage Vin is disabled (or low) before the first supply voltage Vcc is disabled. As shown in waveform (c) the output voltage Vout remains low whilst Vin is below Vcc1 (on the rising edge of Vin) and whilst Vin is below Vcc2 (on the falling edge of Vin).

The waveforms (a) to (g) of FIG. 7 show the operation of the circuit according to FIG. 5, when the first supply voltage Vcc (waveform (b)) is enabled (or high) after the second supply voltage Vin (waveform (a)) is enabled, and the first supply voltage Vcc is disabled (or low) before the second supply voltage Vin is disabled. As shown in waveform (c) the output voltage Vout remains low whilst the first supply voltage Vcc is below the threshold Vcc1 (on the rising edge of Vcc) and whilst the first supply voltage Vcc is below the threshold Vcc2 (on the falling edge of Vcc). In this regard the behaviour of the circuit according FIG. 5, is similar to that of the circuit of FIG. 3 as described above with respect to FIG. 4.

The waveforms (a) to (g) of FIG. 8 show the operation of the circuit as described above with respect to FIG. 5. In FIG. 8, the first supply voltage Vcc (waveform (b)) and the second supply voltage Vin (waveform (a)) are enabled simultaneously. The waveforms (c) to (e) of FIG. 8 are the same as those described above with respect to FIG. 4 and the waveforms (f) and (g) of FIG. 5 show the behaviour of the current when the first supply voltage Vcc (waveform (b)) and the second supply voltage Vin (waveform (a)) are ramping up and down.

When the first supply voltage Vcc is ramping up and below Vcc1, the feedback transistor MPFB is switched on and the current continues to increase exponentially as long as transistor MN1 is in saturation. As shown in waveform (d), the output voltage falls due to an increase in the gate voltage of MN1. Transistor MPFB turns off and the current through MPFB falls to zero. The current through transistor MN1 is limited by the sum of the resistances R1, R2 and R3 as illustrated in waveform (g). Similarly when the supply ramps down and below Vcc2, transistor MPFB again turns on and conducts current until Vcc reaches a level where the transistor MPFB is switched off.

The power supply detection circuit according to embodiments may be implemented as part of a larger functional circuit such as an integrated circuit (IC). The functional circuit may be a logic circuit such as a buffer; an inverter; an AND gate; a NAND gate; an OR gate; a NOR gate; an Exclusive-NOR gate; or an Exclusive-OR gate. Likewise the functional circuit may be any appropriate combination of the above mentioned logic circuits.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A power supply detection circuit, comprising:
a first input stage field effect transistor;
an inverter stage;
a feedback stage field effect transistor;
wherein the inverter stage comprises at least two complementary pairs of transistors having first and second NMOS transistors and first and second PMOS transistors; and
wherein the first NMOS transistor has a gate length that is greater than a gate length of the first PMOS transistor, and the second PMOS transistor has a gate length that is greater than a gate length of the second NMOS transistor.

2. The power supply detection circuit of claim 1, wherein the feedback stage field effect transistor has a gate length that is less than a gate length of the input stage field effect transistor.

3. The power supply detection circuit of claim 1, further comprising a feedforward stage that is connected between an output of the input stage field effect transistor and an input of a NOR stage.

4. The power supply detection circuit of claim 1, further comprising a feedforward stage, connected between an output of the input stage field effect transistor and an input of a NOR stage.

5. The power supply detection circuit of claim 4, wherein the NOR stage comprises first and second complementary NMOS transistors and PMOS transistors, wherein the PMOS transistors has a gate length that is greater than a gate length of the NMOS transistors.

6. The power supply detection circuit of claim 5, wherein the output of the inverter stage is connected to first and second inputs of the NOR stage.

7. The power supply detection circuit of claim 1, further comprising a second input stage field effect transistor connected in series with the first input stage field effect transistor.

8. An integrated circuit comprising the power supply detection circuit as claimed in claim 1.

9. The integrated circuit of claim 8, wherein the integrated circuit is a logic circuit.

10. The integrated circuit of claim 9, wherein the logic circuit is composed of components selected from the group consisting of: a buffer, an inverter, an AND gate, a NAND gate, an OR gate, a NOR gate, an Exclusive-NOR gate, and an Exclusive-OR gate.

11. A power supply detection circuit, comprising:
a first input stage field effect transistor;
an inverter stage comprising a complementary pair of transistors, wherein the complementary pair of transistors further comprises an NMOS transistor and a PMOS transistor configured and arranged so that a gate length of the PMOS transistor and a gate length of the NMOS transistor are different; and
a feedback stage field effect transistor, wherein the feedback stage field effect transistor has a gate length that is less than a gate length of the input stage field effect transistor.

12. The power supply detection circuit of claim 11, further comprising a feedforward stage, connected between an output of the input stage field effect transistor and an input of a NOR stage.

13. A power supply detection circuit, comprising:
a first input stage field effect transistor;
an inverter stage comprising a complementary pair of transistors, wherein the complementary pair of transistors further comprises an NMOS transistor and a PMOS transistor configured and arranged so that a gate length of the PMOS transistor and a gate length of the NMOS transistor are different; and
a feedback stage field effect transistor, wherein the feedback stage field effect transistor has a gate length that is less than a gate length of the input stage field effect transistor to provide a supply voltage hysteresis.

14. A power supply detection circuit, comprising:
a first input stage field effect transistor;
an inverter stage comprising a complementary pair of transistors, wherein the complementary pair of transistors further comprises an NMOS transistor and a PMOS transistor configured and arranged so that a gate length of the PMOS transistor and a gate length of the NMOS transistor are different;
a feedback stage field effect transistor; and
a first resistor, a second resistor and a third resistor,
wherein the first and second resistors are connected between a source and a drain of the feedback stage field effect transistor and the third resistor is connected between the second resistor and a source of the first input field effect transistor.

15. The power supply detection circuit of claim 14, wherein the first resistor, the second resistor and the third resistor have a total resistance that is greater than a drain source resistance of the input stage field effect transistor.

16. The power supply detection circuit of claim 14, further comprising a first filter capacitor and a second filter capacitor configured and arranged to filter high frequency supply voltage ramps.

17. The power supply detection circuit of claim 16, wherein the first filter capacitor is connected between the first and second resistors and the second filter capacitor is connected.

* * * * *